(12) United States Patent
Pan et al.

(10) Patent No.: US 11,049,805 B2
(45) Date of Patent: Jun. 29, 2021

(54) SEMICONDUCTOR PACKAGE AND METHOD

(71) Applicant: Taiwan Semiconductor Manufacturing Company, Ltd., Hsinchu (TW)

(72) Inventors: Kuo Lung Pan, Hsinchu (TW); Shu-Rong Chun, Hsinchu (TW); Teng-Yuan Lo, Hsinchu (TW); Hung-Yi Kuo, Taipei (TW); Chih-Horng Chang, Taipei (TW); Tin-Hao Kuo, Hsinchu (TW); Hao-Yi Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/266,446

(22) Filed: Feb. 4, 2019

(65) Prior Publication Data
US 2020/0006220 A1 Jan. 2, 2020

Related U.S. Application Data

(60) Provisional application No. 62/692,136, filed on Jun. 29, 2018.

(51) Int. Cl.
*H01L 23/522* (2006.01)
*H01L 21/48* (2006.01)
(Continued)

(52) U.S. Cl.
CPC ........ *H01L 23/5226* (2013.01); *H01L 21/486* (2013.01); *H01L 21/4857* (2013.01); *H01L 21/561* (2013.01); *H01L 21/76837* (2013.01); *H01L 21/76871* (2013.01); *H01L 23/293* (2013.01); *H01L 23/3107* (2013.01); *H01L 23/49822* (2013.01); *H01L 24/32* (2013.01); *H01L 24/83* (2013.01); *H01L 24/96* (2013.01); *H01L 24/97* (2013.01); *H01L 25/0657* (2013.01); *H01L 2224/02331* (2013.01);
(Continued)

(58) Field of Classification Search
None
See application file for complete search history.

(56) References Cited

U.S. PATENT DOCUMENTS

| 8,361,842 | B2 | 1/2013 | Yu et al. |
| 8,680,647 | B2 | 3/2014 | Yu et al. |

(Continued)

FOREIGN PATENT DOCUMENTS

| CN | 103681367 A | 3/2014 |
| CN | 105679718 A | 6/2016 |
| JP | 2017108139 A | 6/2017 |

*Primary Examiner* — Khaja Ahmad
(74) *Attorney, Agent, or Firm* — Slater Matsil, LLP

(57) ABSTRACT

In an embodiment, a device includes: a first redistribution structure including a first dielectric layer; a die adhered to a first side of the first redistribution structure; an encapsulant laterally encapsulating the die, the encapsulant being bonded to the first dielectric layer with first covalent bonds; a through via extending through the encapsulant; and first conductive connectors electrically connected to a second side of the first redistribution structure, a subset of the first conductive connectors overlapping an interface of the encapsulant and the die.

19 Claims, 22 Drawing Sheets

(51) Int. Cl.
   *H01L 21/56*     (2006.01)
   *H01L 21/768*    (2006.01)
   *H01L 23/29*     (2006.01)
   *H01L 23/31*     (2006.01)
   *H01L 23/498*    (2006.01)
   *H01L 23/00*     (2006.01)
   *H01L 25/065*    (2006.01)

(52) U.S. Cl.
   CPC ......... *H01L 2224/32501* (2013.01); *H01L 2924/0665* (2013.01); *H01L 2924/15311* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,059,107 B2 | 6/2015 | Pan et al. | |
| 9,899,248 B2 | 2/2018 | Yu et al. | |
| 2004/0005783 A1* | 1/2004 | Lee | H01L 21/02074 438/706 |
| 2010/0317774 A1 | 12/2010 | Sugioka | |
| 2011/0291288 A1 | 12/2011 | Wu et al. | |
| 2012/0248634 A1 | 10/2012 | Mitsukura et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0105918 A1* | 5/2013 | Mieno | H01L 21/02181 257/410 |
| 2013/0168848 A1 | 7/2013 | Lin et al. | |
| 2013/0307140 A1 | 11/2013 | Huang et al. | |
| 2014/0070403 A1* | 3/2014 | Pan | H01L 24/19 257/737 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0255432 A1 | 9/2015 | Lin et al. | |
| 2015/0361211 A1* | 12/2015 | Chun | C09D 163/00 428/76 |
| 2015/0367379 A1* | 12/2015 | Lo | G03F 7/0002 428/201 |
| 2016/0013172 A1 | 1/2016 | Lin et al. | |
| 2016/0071820 A1* | 3/2016 | Yu | H01L 24/19 257/737 |
| 2017/0162461 A1 | 6/2017 | Schwab et al. | |
| 2017/0240743 A1 | 8/2017 | Miyamoto et al. | |
| 2017/0271203 A1 | 9/2017 | Liu et al. | |
| 2017/0301650 A1 | 10/2017 | Yu et al. | |
| 2018/0350631 A1 | 12/2018 | Jiang | |

* cited by examiner

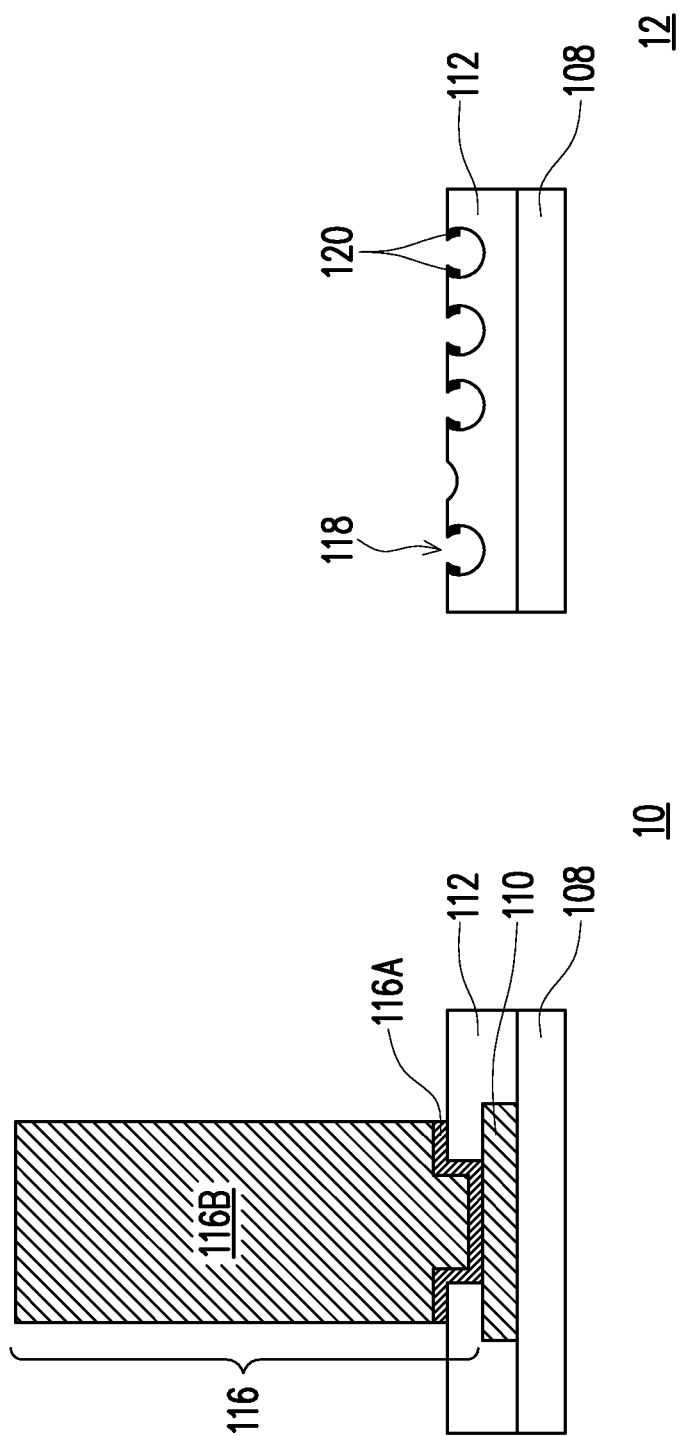

SEMICONDUCTOR PACKAGE AND METHOD

PRIORITY CLAIM AND CROSS-REFERENCE

This application claims the benefit of U.S. Provisional Application No. 62/692,136, filed on Jun. 29, 2018, which application is hereby incorporated herein by reference.

BACKGROUND

The semiconductor industry has experienced rapid growth due to ongoing improvements in the integration density of a variety of electronic 1 components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
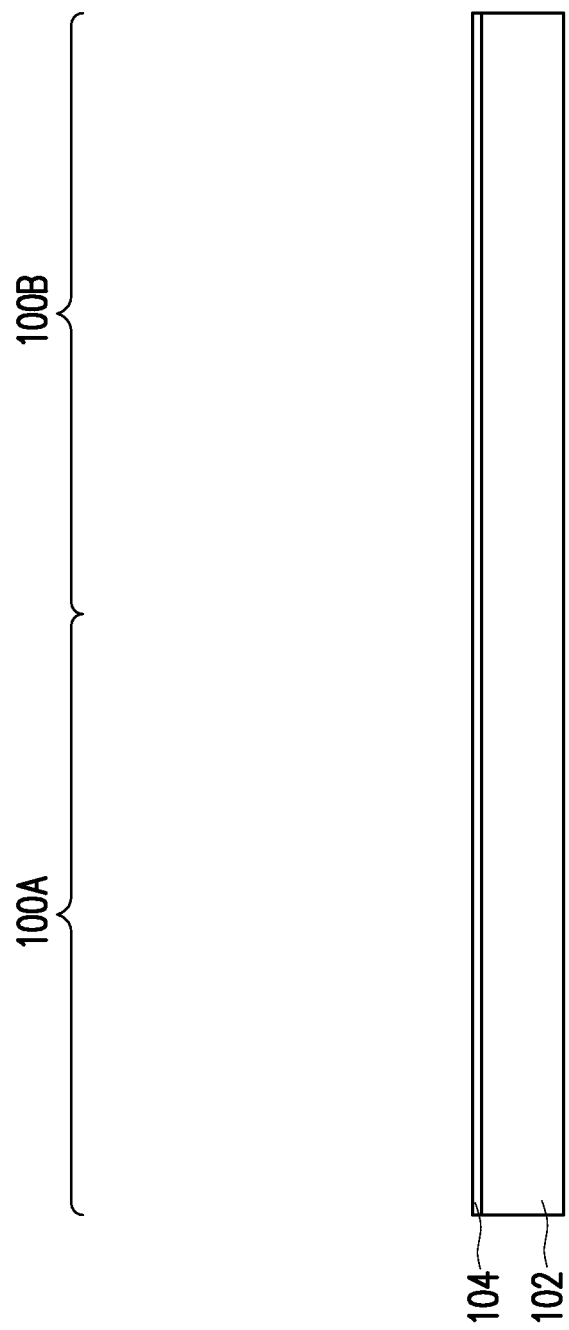
FIGS. 1 through 12 illustrate cross-sectional views of intermediate steps during a process for forming device packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, the topmost dielectric layer of a back-side redistribution structure is cleaned with several surface treatment processes before a package is formed on the back-side redistribution structure. The surface treatment processes may reduce the amount of residual metal embedded in the topmost dielectric layer. The residual metal may be metal leftover from, e.g., a seed layer formed on the topmost dielectric layer. The surface treatment process may also hydroxylate the topmost dielectric layer. A subsequently formed molding compound includes a nucleophile, which forms covalent bonds with the hydroxylated surface. By removing the residual metal and forming covalent bonds with the molding compound, the strength of the interface between the molding compound and topmost dielectric layer may be increased, which may help avoid delamination of subsequently-formed features. Features may thus be formed in regions of the package that are subject to higher mechanical strain.

FIGS. 1 through 12 illustrate cross-sectional views of intermediate steps during a process for forming first packages 200 (see FIG. 12), in accordance with some embodiments. A first package region 100A and a second package region 100B are illustrated, and a first package 200 is formed in each package region. The first packages 200 may also be referred to as integrated fan-out (InFO) packages.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of coplanarity.

Figure 2:
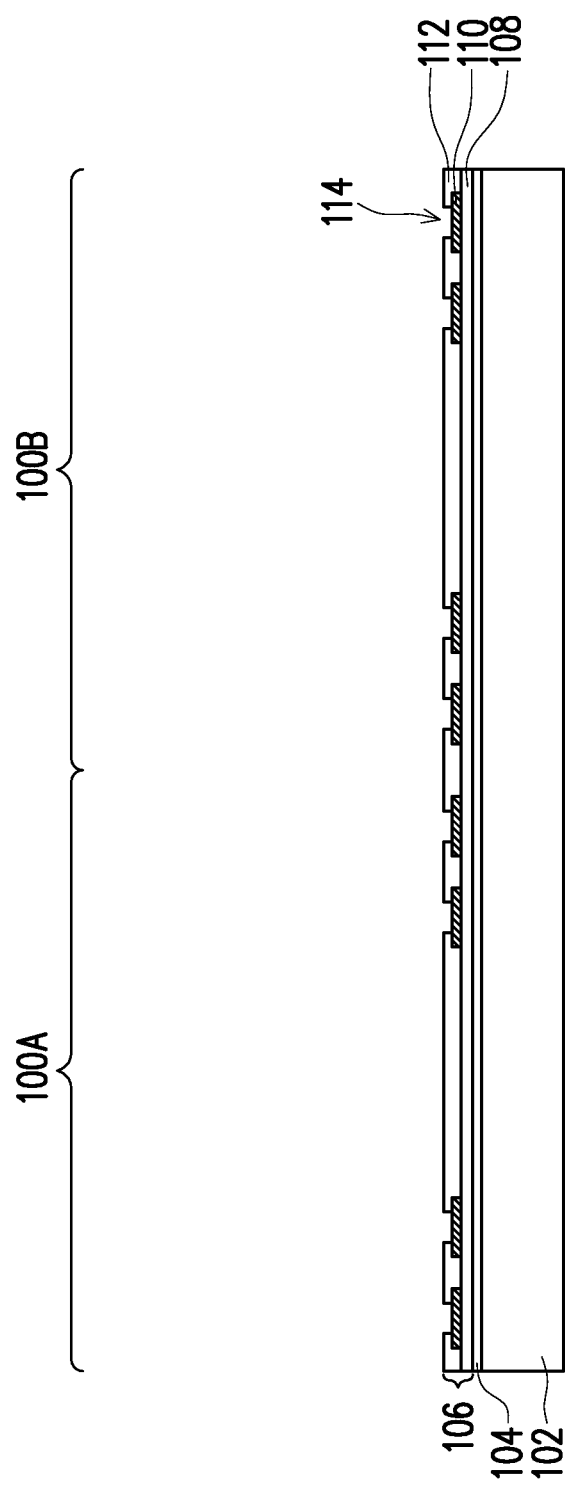

In FIG. 2, a back-side redistribution structure 106 is formed on the release layer 104. In the embodiment shown, the back-side redistribution structure 106 includes a dielectric layer 108, a metallization pattern 110 (sometimes referred to as redistribution layers or redistribution lines), and a dielectric layer 112.

The dielectric layer 108 is formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

The metallization pattern 110 is formed on the dielectric layer 108. As an example to form metallization pattern 110, a seed layer (not shown) is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 is formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be by an acceptable process, such as by exposing the dielectric layer 112 to light when the dielectric layer 112 is a photo-sensitive material or by etching using, for example, an anisotropic etch. In some embodiments, the dielectric layer 112 is a material with a high coefficient of thermal expansion (CTE), such as a polyimide. In some embodiments, the dielectric layer 112 has a CTE in the range of from about 45 ppm/° C. to about 55 ppm/° C.

It should be appreciated that the back-side redistribution structure 106 may include any number of dielectric layers and metallization patterns. Additional dielectric layers and metallization patterns may be formed by repeating the processes for forming metallization pattern 110 and dielectric layer 112. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 3A:
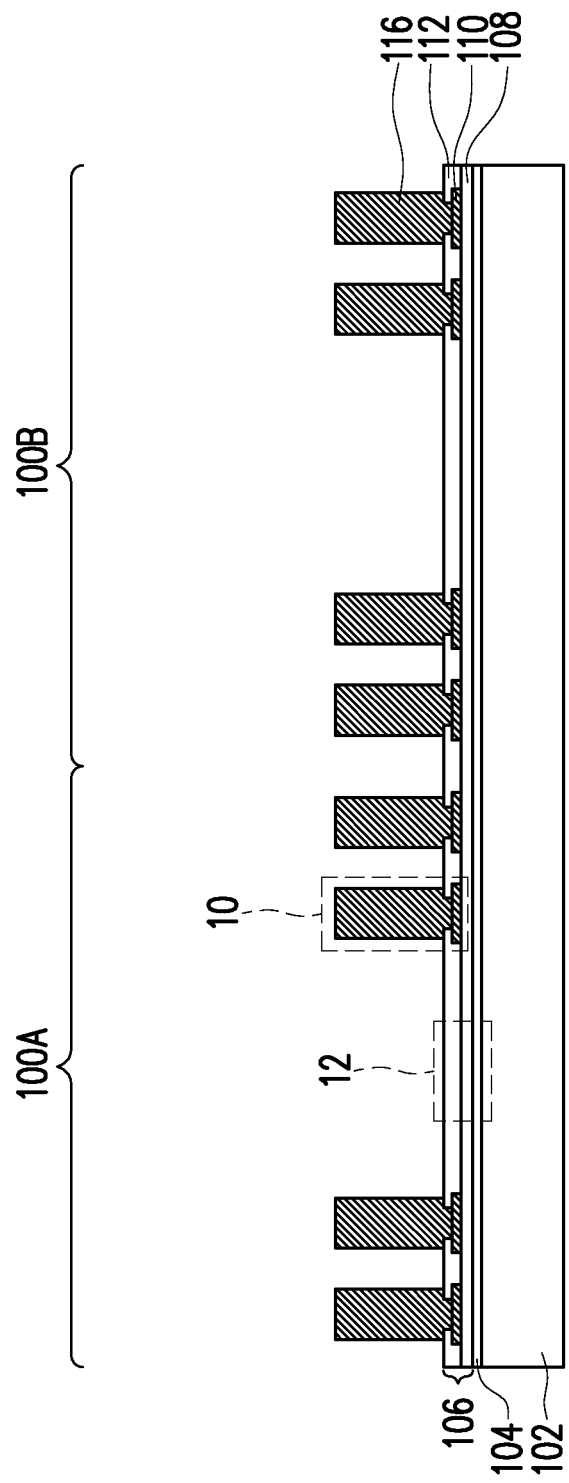

In FIG. 3A, through vias 116 are formed in the openings 114 and extending away from the topmost dielectric layer of the back-side redistribution structure 106 (e.g., the dielectric layer 112 in the illustrated embodiment). FIG. 3B is a detailed view of a region 10, and is described in conjunction with FIG. 3A. As an example to form the through vias 116, a seed layer 116A is formed over the back-side redistribution structure 106, e.g., on the dielectric layer 112 and portions of the metallization pattern 110 exposed by the openings 114. In some embodiments, the seed layer 116A is a metal layer, which may be a single layer or a composite layer comprising a plurality of sub-layers formed of different materials. In a particular embodiment, the seed layer 116A comprises a titanium layer and a copper layer over the titanium layer. The seed layer 116A may be formed using, for example, PVD or the like. A photoresist is formed and patterned on the seed layer 116A. The photoresist may be formed by spin coating or the like and may be exposed to light for patterning. The pattern of the photoresist corresponds to conductive vias. The patterning forms openings through the photoresist to expose the seed layer 116A. A conductive material 116B is formed in the openings of the photoresist and on the exposed portions of the seed layer 116A. The conductive material 116B may be formed by plating, such as electroplating or electroless plating, or the like. The conductive material 116B may comprise a metal, like copper, titanium, tungsten, aluminum, or the like. The photoresist and portions of the seed layer 116A on which the conductive material 116B is not formed are removed. The photoresist may be removed by an acceptable ashing or stripping process, such as using an oxygen plasma or the like. Once the photoresist is removed, exposed portions of the seed layer 116A are removed, such as by using an acceptable etching process, such as by wet or dry etching. The remaining portions of the seed layer 116A and conductive material 116B form the through vias 116.

FIG. 3C is a detailed view of a region 12 of the back-side redistribution structure 106 after the exposed portions of the seed layer 116A (see FIG. 3B) are removed. In the embodiment where the seed layer 116A comprises a titanium layer and a copper layer over the titanium layer, the seed layer 116A is formed by a PVD process such as sputtering. The PVD process may include a pre-etching step that increases the roughness of the top surface of the dielectric layer 112 and forms pits 118 in the top surface of the dielectric layer 112. When the titanium layer is sputtered on the dielectric layer 112, some residual metal 120 (e.g., titanium) may be implanted into the dielectric layer 112. In particular, the residual metal 120 may be trapped in the pits 118 formed in the roughened top surface of the dielectric layer 112.

Figure 4A:
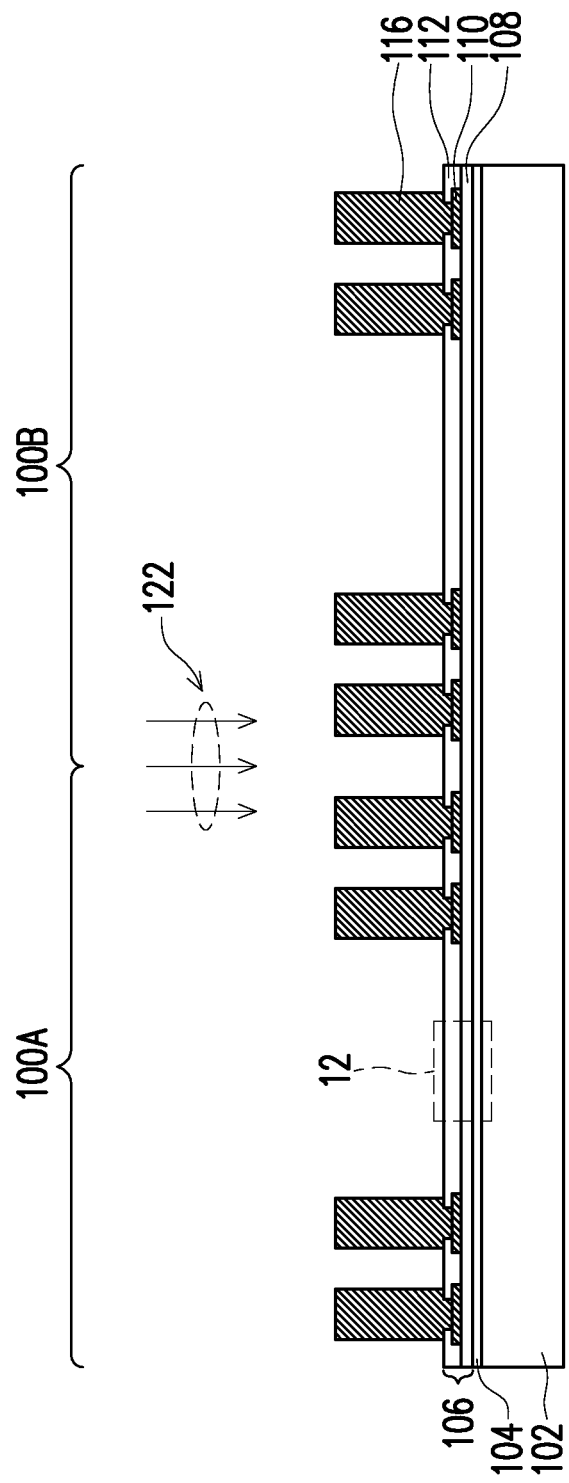

In FIG. 4A, the topmost dielectric layer of the back-side redistribution structure 106 (e.g., the dielectric layer 112 in the illustrated embodiment) is cleaned with a first surface treatment process 122. In some embodiments, the first surface treatment process 122 includes an etch process on the top surface of the dielectric layer 112 to expose the buried residual metal 120 and further includes a hydroxylation process on the top surface of the dielectric layer 112. For example, in some embodiments, the first surface treatment process 122 is a plasma treatment process. The plasma treatment process may be performed with precursors that leave behind hydroxyl groups on the treated surfaces, such as Ar, $O_2$, $N_2$, $CF_4$, or a combination thereof. In such embodiments, the plasma treatment process may be performed at a temperature of from about 25° C. to about 100° C. (such as about 70° C.), and may be performed for a time of from about 30 second to about 180 seconds (such as less than about 180 seconds). In some embodiments, the precursors may include a small quantity of $H_2$, such as at concentration of from about 0.1% to about 10%. Including $H_2$ may help create a plasma that removes the material of the dielectric layer 112. In an embodiment, precursors of the plasma treatment process include $O_2$ and $H_2$. As such, the plasma treatment process may be thought of as a combination of a dry etch and a surface hydroxylation. Some residue of the plasma treatment precursors may remain on the top surface of the dielectric layer 112 after the first surface treatment process 122.

Figure 4B:
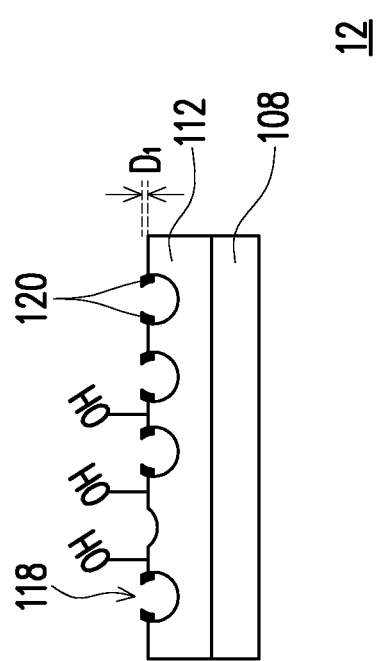

FIG. 4B is a detailed view of the region 12 of the back-side redistribution structure 106 after the first surface treatment process 122. After the first surface treatment process 122, the dielectric layer 112 is thinned by a distance $D_1$, such that the residual metal 120 trapped in the pits 118 of the dielectric layer 112 is more exposed than before the first surface treatment process 122. Further, after the first surface treatment process 122, dangling hydroxyl groups are formed on the top surface of the dielectric layer 112.

Figure 5A:
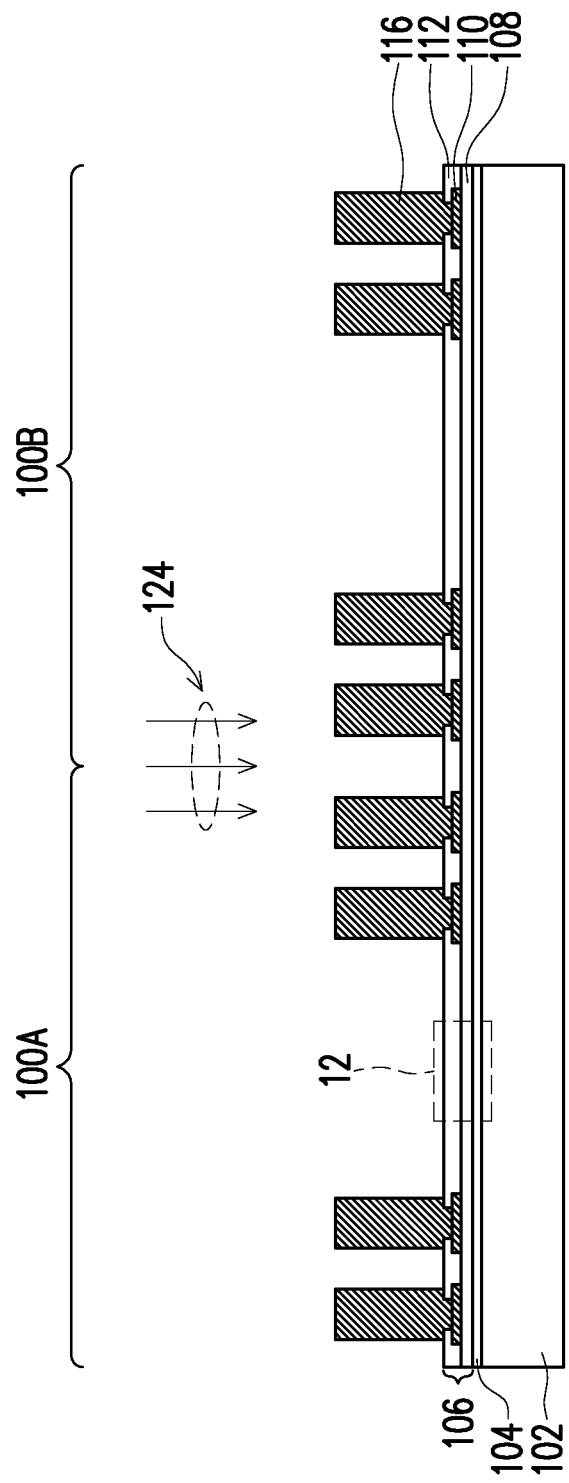

In FIG. 5A, the topmost dielectric layer of the back-side redistribution structure 106 (e.g., the dielectric layer 112 in the illustrated embodiment) is cleaned with a second surface treatment process 124. In some embodiments, the second surface treatment process 124 removes the exposed residual metal 120. In some embodiments, the second surface treatment process 124 includes an etching process such as a wet etch. In an embodiment, etchants of the wet etching process include hydrofluoric acid. The wet etching process may be selective to the material of the residual metal 120 such that the thickness of the dielectric layer 112 is not substantially decreased. In some embodiments, the second surface treatment process 124 is a plasma etching process that removes the residual metal 120. Some residue of the plasma treatment precursors may remain on the top surface of the dielectric layer 112 after the second surface treatment process 124.

Figure 5B:
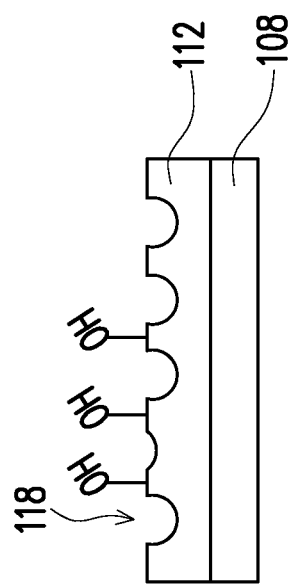

FIG. 5B is a detailed view of the region 12 of the back-side redistribution structure 106 after the second surface treatment process 124. After the second surface treatment process 124, the residual metal 120 trapped in the pits 118 of the dielectric layer 112 is eliminated or at least the quantity is reduced.

Figure 6:
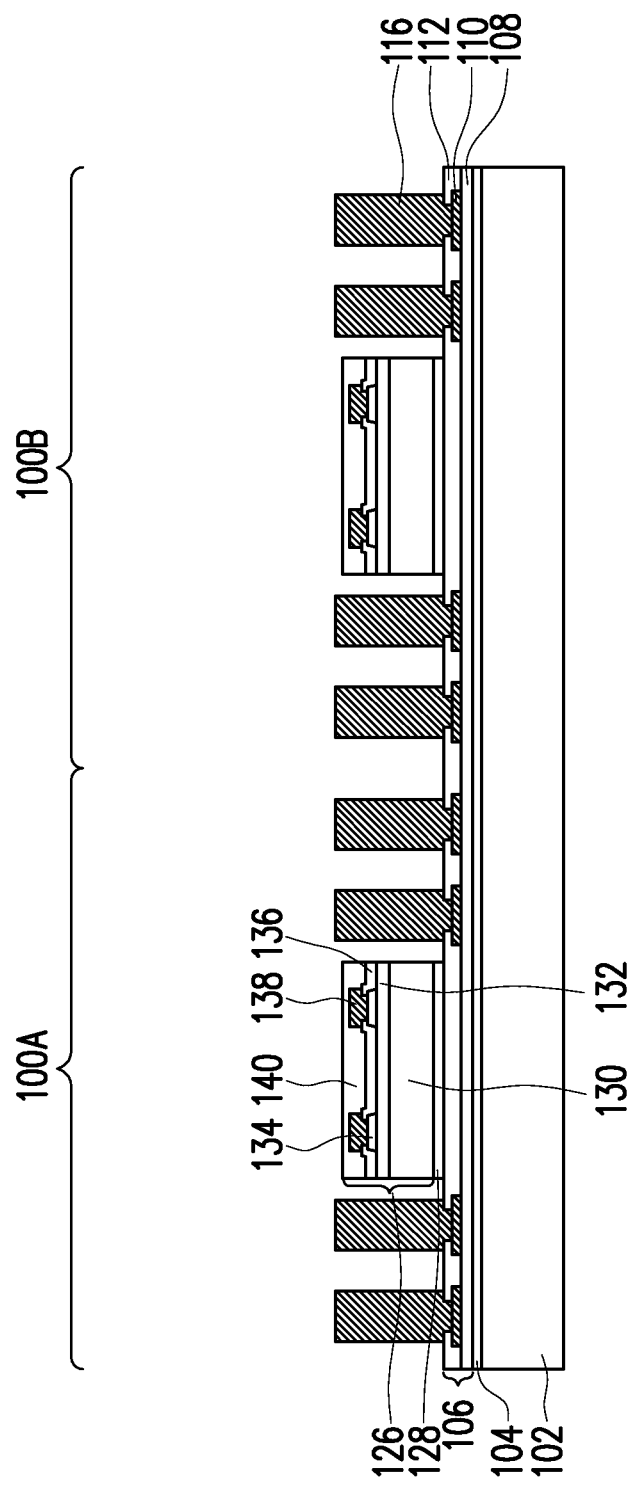

In FIG. 6, integrated circuit dies 126 are adhered to the dielectric layer 112 by an adhesive 128. The integrated circuit dies 126 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 126 may be different sizes (e.g., different heights and/or surface areas), and in other embodiments, the integrated circuit dies 126 may be the same size (e.g., same heights and/or surface areas).

Before being adhered to the dielectric layer 112, the integrated circuit dies 126 may be processed according to applicable manufacturing processes to form integrated circuits in the integrated circuit dies 126. For example, the integrated circuit dies 126 each include a semiconductor substrate 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 130 and may be interconnected by interconnect structures 132 formed by, for example, metallization patterns in one or more dielectric layers on the semiconductor substrate 130 to form an integrated circuit.

The integrated circuit dies 126 further comprise pads 134, such as aluminum pads, to which external connections are made. The pads 134 are on what may be referred to as respective active sides of the integrated circuit dies 126. Passivation films 136 are on the integrated circuit dies 126 and on portions of the pads 134. Openings extend through the passivation films 136 to the pads 134. Die connectors 138, such as conductive pillars (for example, comprising a metal such as copper), extend through the openings in the passivation films 136 and are mechanically and electrically coupled to the respective pads 134. The die connectors 138 may be formed by, for example, plating, or the like. The die connectors 138 electrically couple the respective integrated circuits of the integrated circuit dies 126.

A dielectric material 140 is on the active sides of the integrated circuit dies 126, such as on the passivation films 136 and the die connectors 138. The dielectric material 140 laterally encapsulates the die connectors 138, and the dielectric material 140 is laterally coterminous with the respective integrated circuit dies 126. The dielectric material 140 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 128 is on back-sides of the integrated circuit dies 126 and adheres the integrated circuit dies 126 to the back-side redistribution structure 106, such as the dielectric layer 112. The adhesive 128 may be any suitable adhesive, epoxy, die attach film (DAF), or the like. In an embodiment, the adhesive 128 includes a nucleophilic additive. The nucleophilic additive may be any nucleophile, such as ethylene glycol, 2-ethoxyethanol, ethanolamine hydrochloride, or the like. In an embodiment, the adhesive 128 is an epoxy with the nucleophile. The adhesive 128 may be applied to a back-side of the integrated circuit dies 126 or may be applied over the surface of the carrier substrate 102. For example, the adhesive 128 may be applied to the back-side of the integrated circuit dies 126 before singulating to separate the integrated circuit dies 126.

Although one integrated circuit die 126 is illustrated as being adhered in each of the first package region 100A and the second package region 100B, it should be appreciated that more integrated circuit dies 126 may be adhered in each package region. For example, multiple integrated circuit dies 126 may be adhered in each region. Further, the integrated circuit dies 126 may vary in size. In some embodiments, the integrated circuit die 126 may be dies with a large footprint, such as system-on-chip (SoC) devices. In embodiments where the integrated circuit die 126 have a large footprint, the space available for the through vias 116 in the package regions may be limited. Use of the back-side redistribution structure 106 allows for an improved interconnect arrangement when the package regions have limited space available for the through vias 116.

Figure 7A:
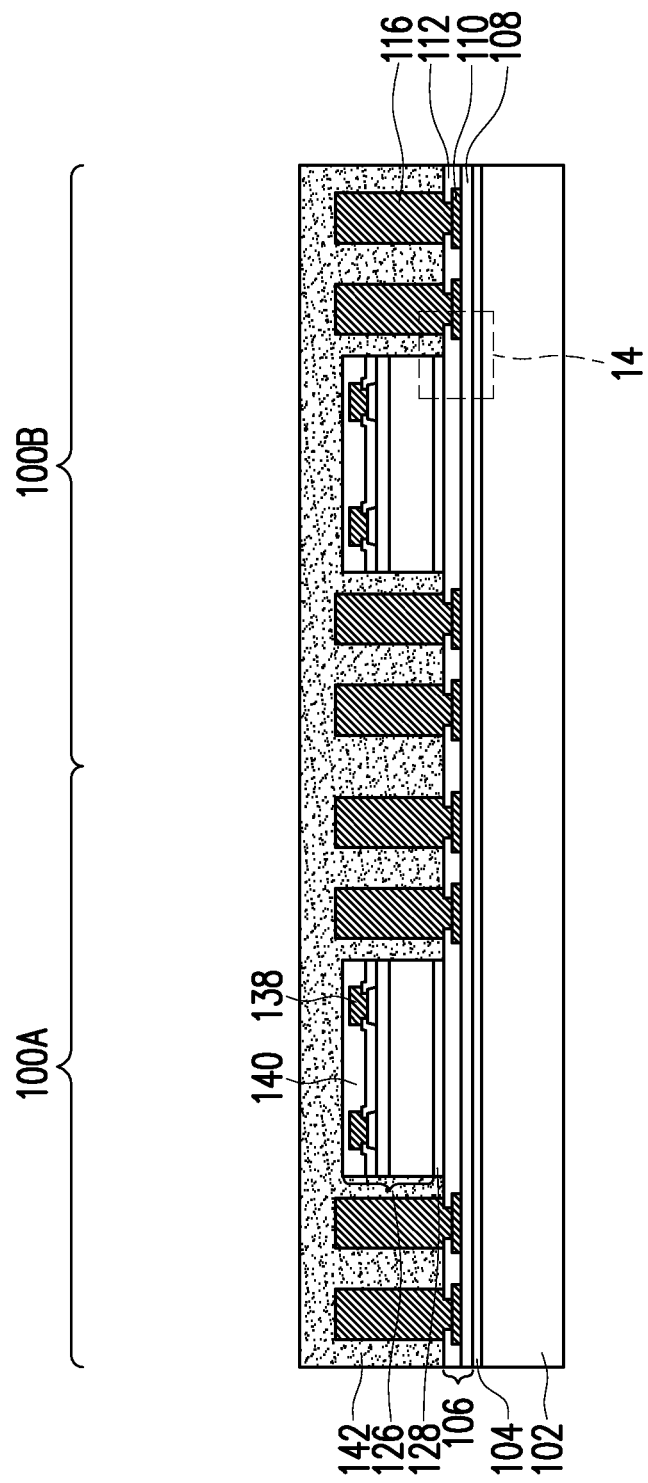

In FIG. 7A, an encapsulant 142 is formed on the various components. After formation, the encapsulant 142 laterally encapsulates the through vias 116 and integrated circuit dies 126. The encapsulant 142 may be a molding compound, epoxy, or the like. The encapsulant 142 may have a CTE that is similar to the CTE of the dielectric layer 112, which may reduce CTE mismatch, reducing warpage. In some embodiments, the encapsulant 142 has a CTE in the range of from about 10 ppm/° C. to about 65 ppm/° C. In an embodiment, the encapsulant 142 includes a nucleophilic additive. The nucleophilic additive may be any nucleophile, such as ethylene glycol, 2-ethoxyethanol, ethanolamine hydrochloride, or the like. The nucleophilic additive may be the same nucleophilic additive in the adhesive 128. The encapsulant 142 may be applied by compression molding, transfer molding, or the like, and may be formed over the carrier substrate 102 such that the through vias 116 and/or the integrated circuit dies 126 are buried or covered. The encapsulant 142 is then cured.

Figure 7B:
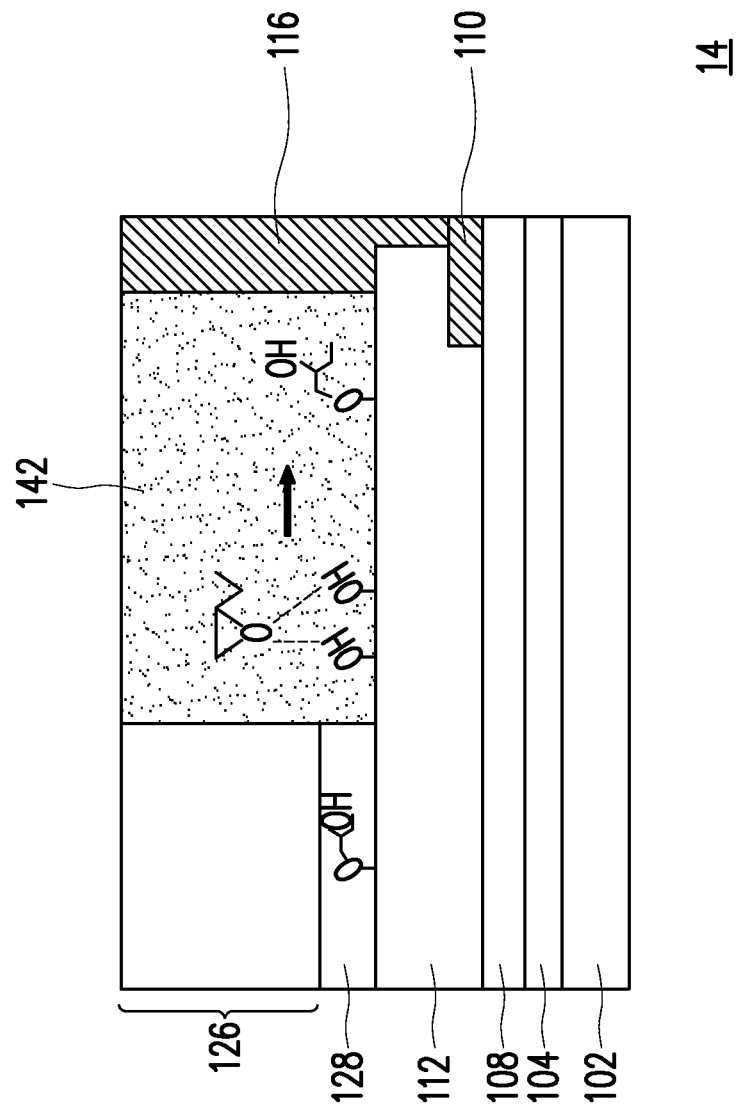
Figure 7C:
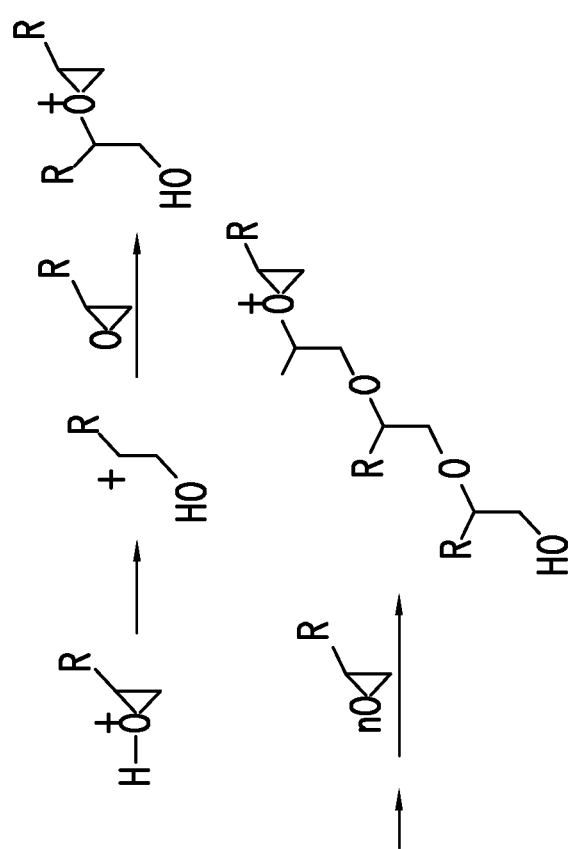

FIG. 7B is a detailed view of a region 14 of the encapsulant 142 after the encapsulant 142 is cured. The adhesive 128 may also be cured. After the curing, some of the nucleophilic additives of the encapsulant 142 and the adhesive 128 react with the dangling hydroxyl groups on the top surface of the dielectric layer 112 to form covalent bonds between the dielectric layer 112 and encapsulant 142. In particular, the oxygen atoms of the nucleophilic additives break apart the hydroxyl groups, thereby forming a bond between the nucleophilic additives and the material of the dielectric layer 112. An example of such a reaction is shown in FIG. 7C. Some of the nucleophilic additives may not form covalent bonds, and may remain in the encapsulant 142. As a result, the adhesion of the interface between the dielectric layer 112 and encapsulant 142 may be improved. In an embodiment, the adhesion may be increased by as much as 22% over interfaces lacking covalent bonds, and the interface between the dielectric layer 112 and encapsulant 142 may be capable of withstanding a force as large as 14.8 gf. The adhesion of the interface between the adhesive 128 and dielectric layer 112 may be similarly improved. Improving the adhesion of the interface between the dielectric layer 112 and encapsulant 142/adhesive 128 may reduce the chances of interface delamination in subsequent processing steps. In some embodiments, the covalent bonds do not consume all of the dangling hydroxyl groups on the top surface of the dielectric layer 112, and some trace hydroxyl groups remain on or in the dielectric layer 112.

Figure 8:
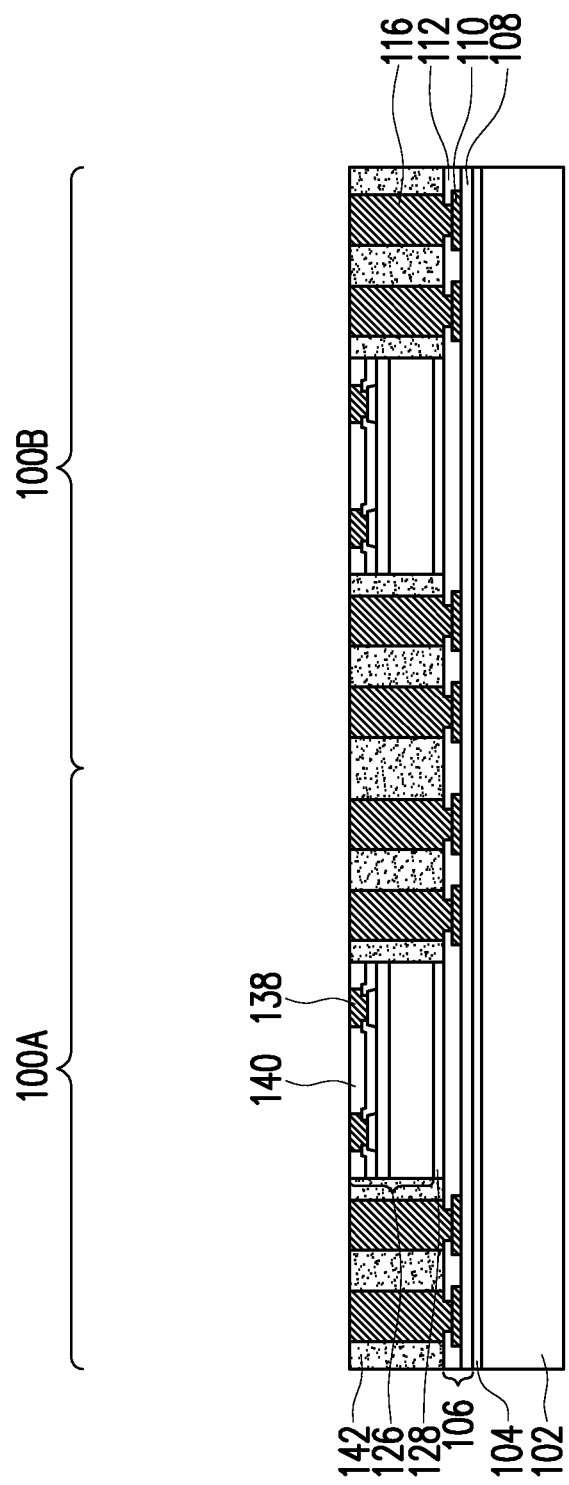

In FIG. 8, a planarization process is performed on the encapsulant 142 to expose the through vias 116 and the die connectors 138. The planarization process may also grind the dielectric material 140. Top surfaces of the through vias 116, die connectors 138, dielectric material 140, and encapsulant 142 are coplanar after the planarization process. The planarization process may be, for example, a chemical-mechanical polish (CMP), a grinding process, or the like. In some embodiments, the planarization may be omitted, for example, if the through vias 116 and die connectors 138 are already exposed.

Figure 9:
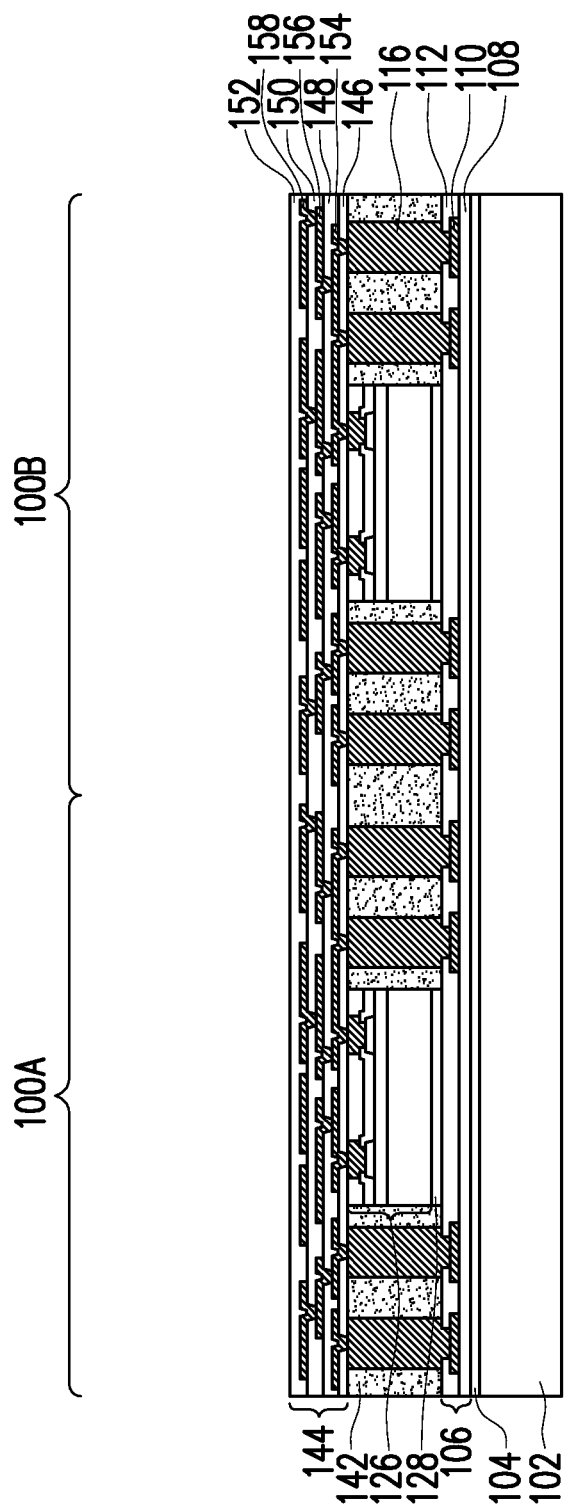

In FIG. 9, a front-side redistribution structure 144 is formed over the through vias 116, encapsulant 142, and integrated circuit dies 126. The front-side redistribution structure 144 includes dielectric layers 146, 148, 150, and 152; and metallization patterns 154, 156, and 158. The metallization patterns may also be referred to as redistribution layers or redistribution lines.

The front-side redistribution structure 144 is shown as an example. More or fewer dielectric layers and metallization patterns may be formed in the front-side redistribution structure 144. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 144, the dielectric layer 146 is deposited on the encapsulant 142, through vias 116, and die connectors 138. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. The dielectric layer 146 is then patterned. The patterning forms openings (not shown) exposing portions of the through vias 116 and the die connectors 138. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 can be developed after the exposure.

The metallization pattern 154 is then formed. The metallization pattern 154 includes conductive lines on and extending along the major surface of the dielectric layer 146. The metallization pattern 154 further includes conductive vias extending through the dielectric layer 146 to be physically and electrically connected to the through vias 116 and the integrated circuit dies 126. To form the metallization pattern 154, a seed layer (not shown) is formed over the dielectric layer 146 and in the openings extending through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist (not shown) is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is then formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 154. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

The dielectric layer 148 is deposited on the dielectric layer 146 and metallization pattern 154. The dielectric layer 148 may be formed in a manner similar to the dielectric layer 146, and may be formed of the same material as the dielectric layer 146.

The metallization pattern 156 is then formed. The metallization pattern 156 includes conductive lines on and extending along the major surface of the dielectric layer 148. The metallization pattern 156 further includes conductive vias extending through the dielectric layer 148 to be physically and electrically connected to the metallization pattern 154.

The metallization pattern 156 may be formed in a manner similar to the metallization pattern 154, and may be formed of the same material as the metallization pattern 154.

The dielectric layer 150 is deposited on the dielectric layer 148 and metallization pattern 156. The dielectric layer 150 may be formed in a manner similar to the dielectric layer 146, and may be formed of the same material as the dielectric layer 146.

The metallization pattern 158 is then formed. The metallization pattern 158 includes conductive lines on and extending along the major surface of the dielectric layer 150. The metallization pattern 158 further includes conductive vias extending through the dielectric layer 150 to be physically and electrically connected to the metallization pattern 156. The metallization pattern 158 may be formed in a manner similar to the metallization pattern 154, and may be formed of the same material as the metallization pattern 154.

The dielectric layer 152 is deposited on the dielectric layer 150 and metallization pattern 158. The dielectric layer 152 may be formed in a manner similar to the dielectric layer 146, and may be formed of the same material as the dielectric layer 146.

Figure 10:
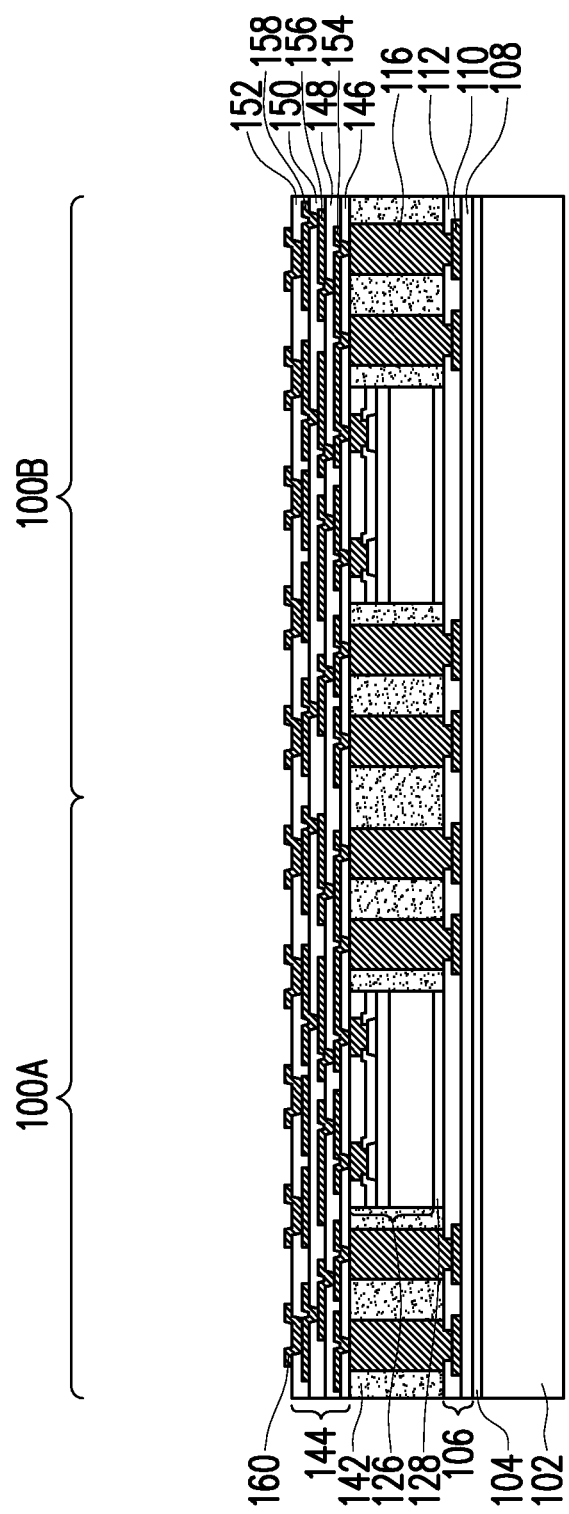

In FIG. 10, UBMs 160 are formed on and extending through the dielectric layer 152. As an example to form the UBMs 160, the dielectric layer 152 may be patterned to form openings (not shown) exposing portions of the metallization pattern 158. The patterning may be by an acceptable process, such as by exposing the dielectric layer 152 to light when the dielectric layer 152 is a photo-sensitive material or by etching using, for example, an anisotropic etch. If the dielectric layer 152 is a photo-sensitive material, the dielectric layer 152 can be developed after the exposure. The openings for the UBMs 160 may be wider than the openings for the conductive via portions of the metallization patterns 154, 156, and 158. A seed layer (not shown) is formed over the dielectric layer 152 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 160. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 160. In embodiments where the UBMs 160 are formed differently, more photoresist and patterning steps may be utilized.

Figure 11A:
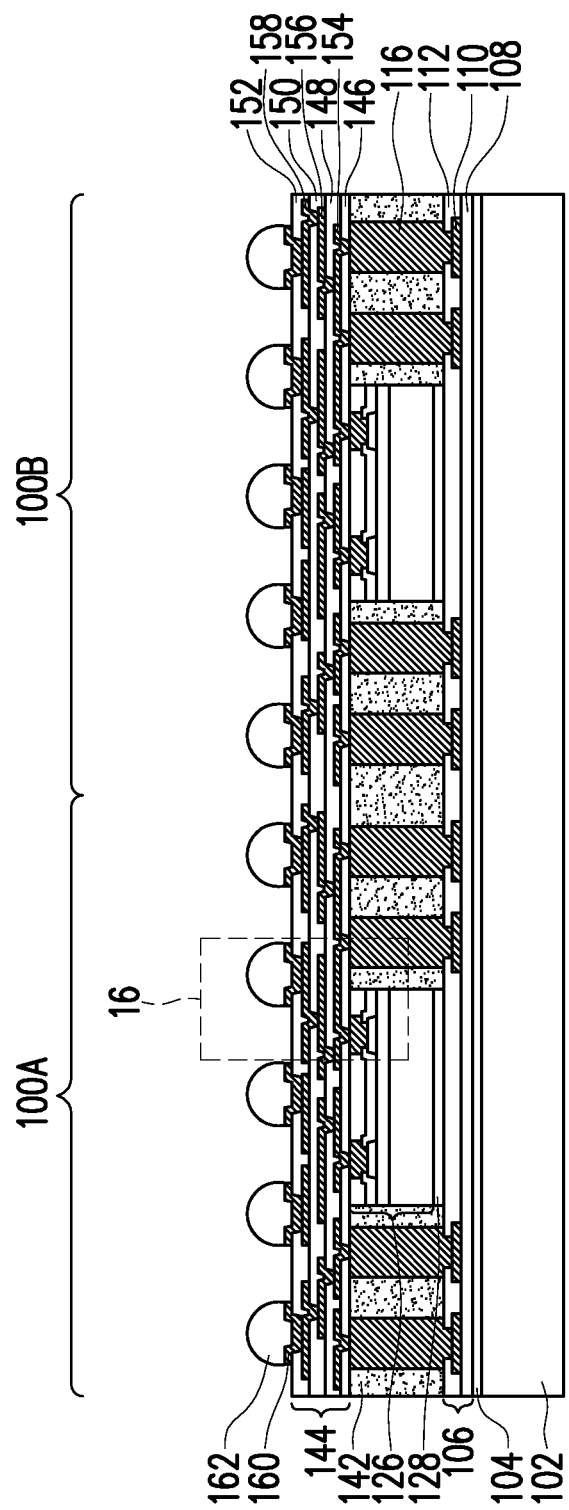

In FIG. 11A, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 162 may include a conductive material such as solder, copper, aluminum, gold, nickel, silver, palladium, tin, the like, or a combination thereof. In some embodiments, the conductive connectors 162 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 162 comprise metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 11B:
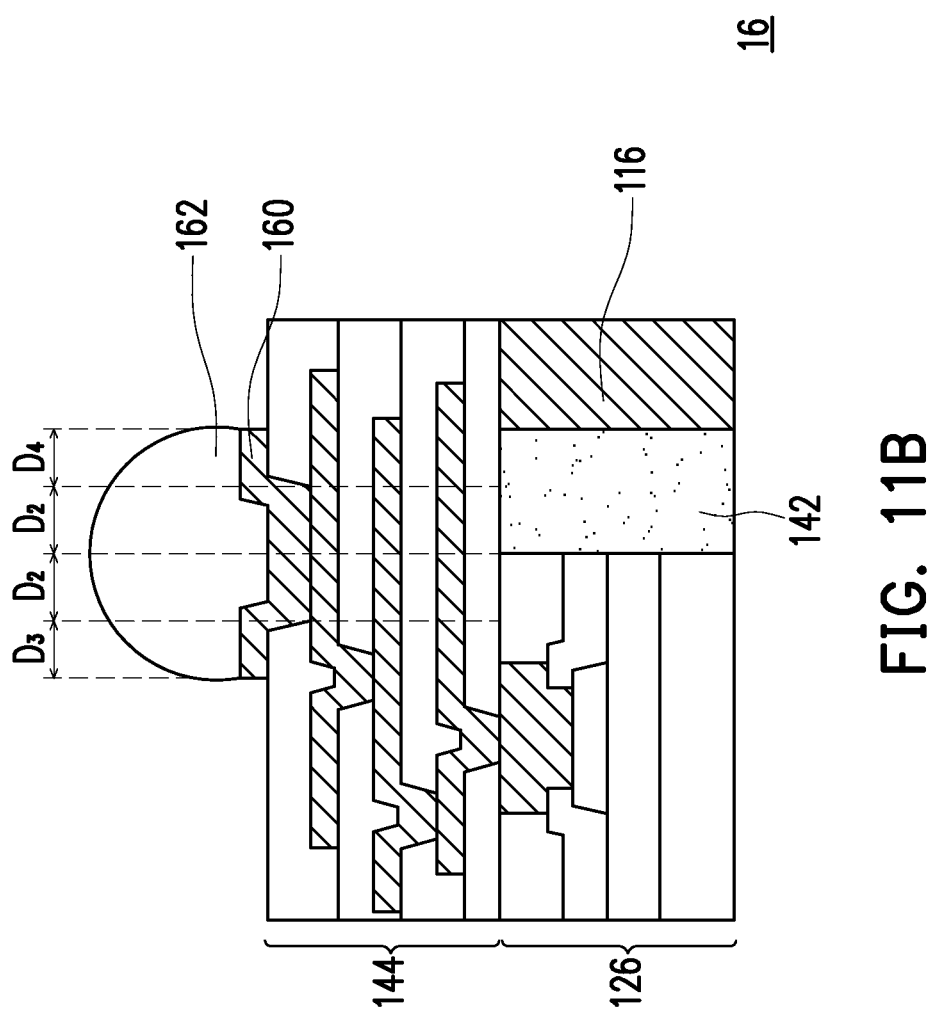

FIG. 11B is a detailed view of a region 16 of FIG. 11A illustrating the integrated circuit die 126 and the front-side redistribution structure 144 after the conductive connectors 162 are formed. A subset of the conductive connectors 162 are placed along an edge or a corner of the integrated circuit die 126, in a top-down view. The edges of the integrated circuit die 126 are defined by the interface of the integrated circuit die 126 and the encapsulant 142. The edges and corners of the integrated circuit die 126 are typically subject to higher mechanical strain. For example, conductive connectors 162 along the edges and corners of the integrated circuit die 126 may be subject to up to 10% more strain than conductive connectors 162 in the center of the integrated circuit die 126. The UBMs 160 are similarly subjected to increased strain. By improving the adhesion of the interface between the dielectric layer 112 and encapsulant 142/adhesive 128 in prior steps (e.g., with the surface treatment processes 122 and 124), the encapsulant 142 and integrated circuit die 126 are less likely to exert forces on the front-side redistribution structure 144. Thus, the chances of the UBMs 160 delaminating from the front-side redistribution structure 144 when under increased strain may be decreased. More costly delamination solutions, such as rearranging the positions of the integrated circuit die 126 or conductive connectors 162, may thus be avoided. This may allow the integrated circuit dies 126 to be more uniformly distributed in the resulting first packages 200, allowing the encapsulant 142 to be more uniformly distributed around the integrated circuit dies 126.

The conductive connectors 162 along the edges and corners of the integrated circuit die 126 may be formed overlapping the edges and corners of the integrated circuit die 126. In an embodiments, a conductive connector 162 is disposed in a margin area near an edge or a corner of the integrated circuit die 126. Boundaries of the margin area are disposed a distance $D_2$ from the edge or corner of the integrated circuit die 126. In an embodiment, the distance $D_2$ may be about 25 μm. The entirety of the margin area may be occupied by the conductive connector 162. A first side of the conductive connector 162 is disposed a distance $D_3$ outside of the margin area, and a second side of the conductive connector 162 is disposed a distance $D_4$ outside of the margin area. In an embodiment, the distances $D_3$ and $D_4$ may each be at least one quarter of the total width of the respective conductive connector 162. In other words, when the conductive connectors 162 have a width, at least one quarter of the width of each respective conductive connector 162 is disposed over the integrated circuit die 126, and at least one quarter of the width of each respective conductive connector 126 is disposed over the encapsulant 142. Forming the conductive connectors 162 along the edges and corners of the integrated circuit die 126 may allow the quantity of conductive connectors 162 to be increased, thus increasing the input/output (I/O) count of the resulting first packages 200.

Figure 12:
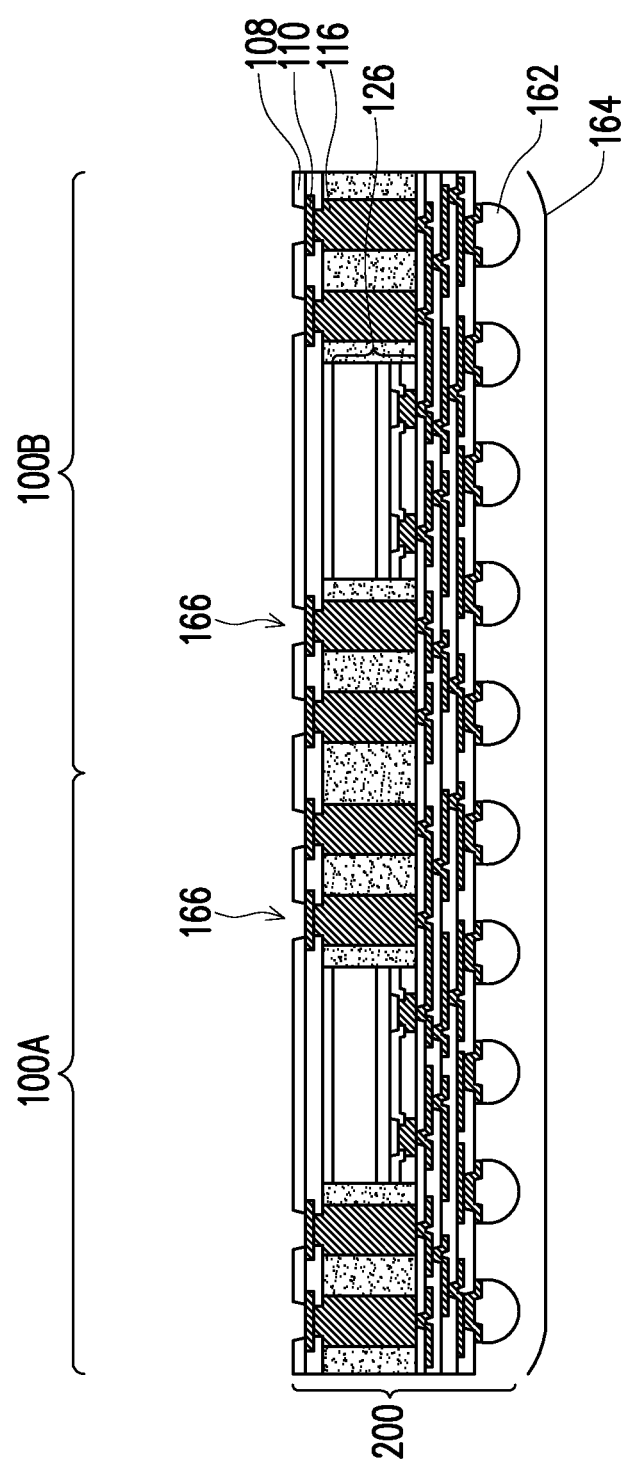

In FIG. 12, a carrier substrate de-bonding is performed to detach (de-bond) the carrier substrate 102 from the backside redistribution structure 106, e.g., the dielectric layer 108. Features remaining after the debonding (e.g., in the first package region 100A and the second package region 100B) form the first packages 200. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape 164. Further, openings 166 are formed through the dielectric layer 108 to expose portions of the metallization pattern 110. The openings 166 may be formed, for example, using laser drilling, etching, or the like.

Figure 13A:
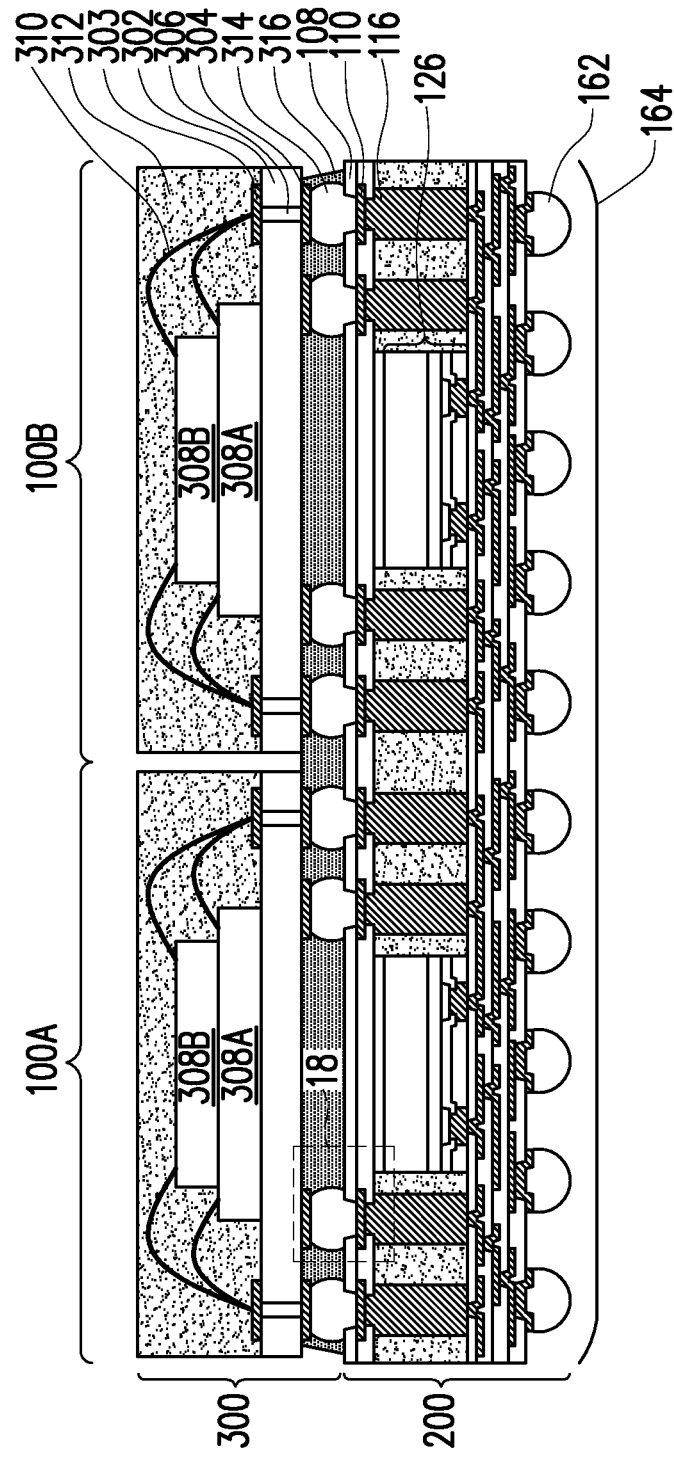
FIGS. 13A through 14 illustrate cross-sectional views of intermediate steps during a process for forming a package structure, in accordance with some embodiments.
Figure 13B:
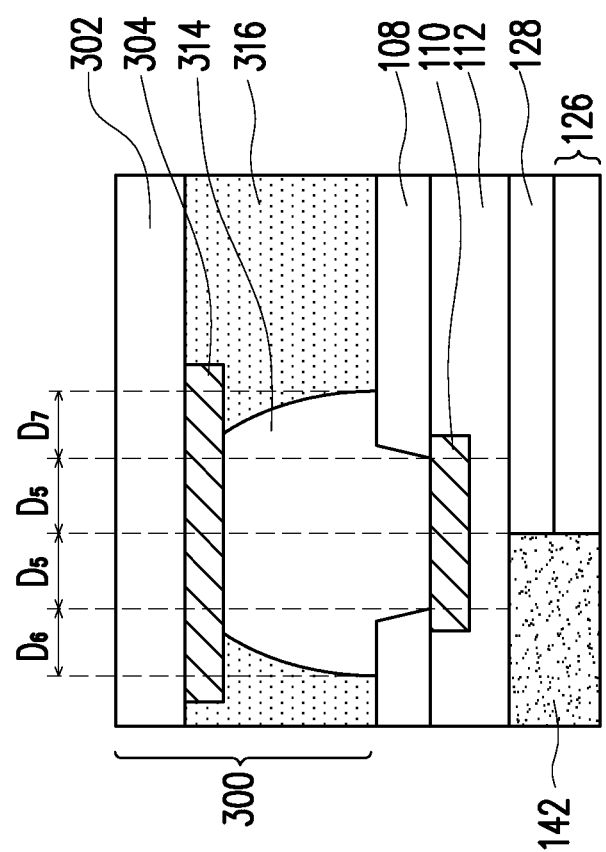
Figure 13C:
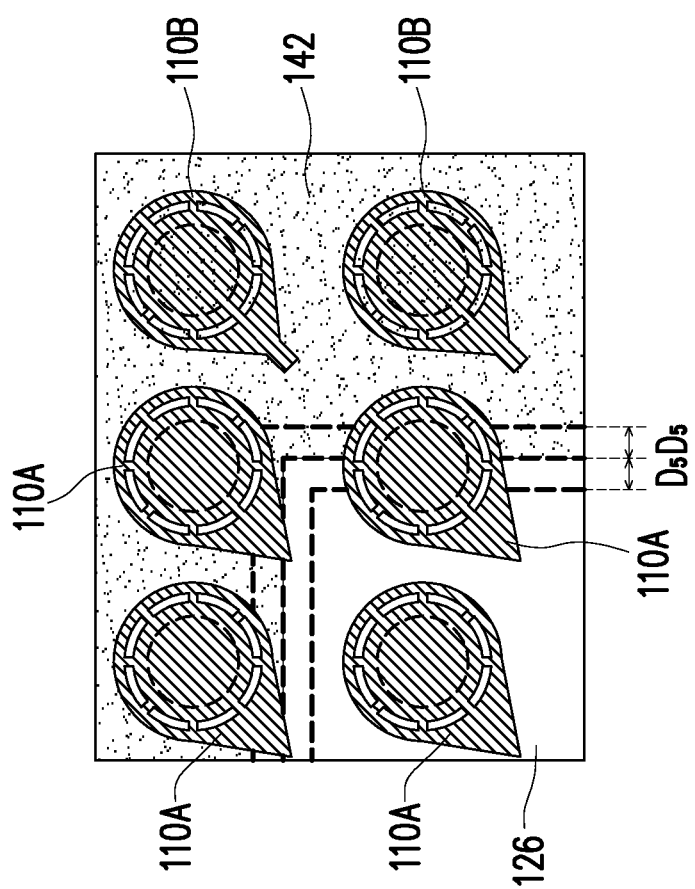
Figure 14:
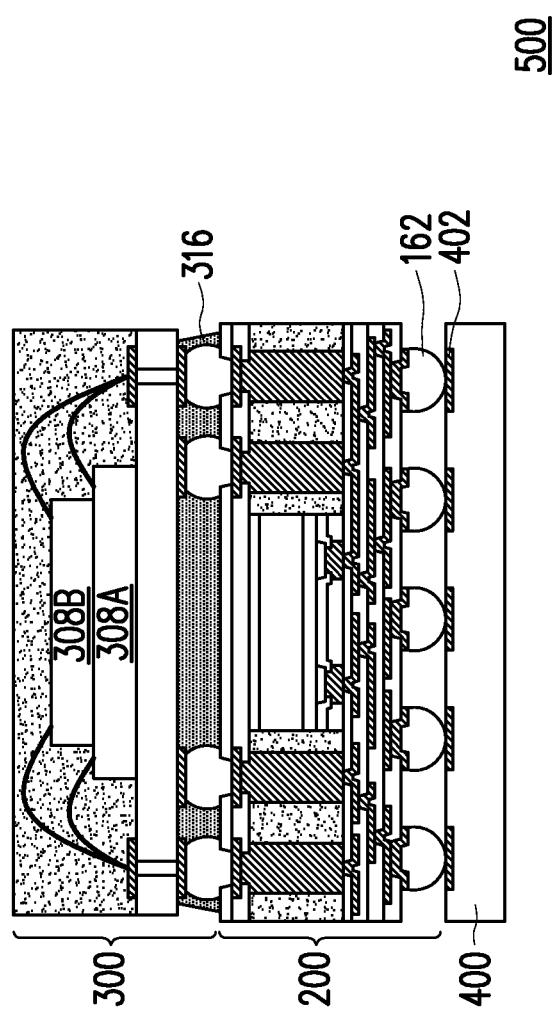

FIGS. 13A through 14 illustrate cross-sectional views of intermediate steps during a process for forming a package structure 500 (see FIG. 14), in accordance with some embodiments. The package structure 500 may be referred to a package-on-package (PoP) structure.

In FIG. 13A, a second package 300 is attached to each of the first packages 200. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side-by-side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). A wide variety of devices such as transistors, capacitors, resistors, combinations of these, and the like may be used to generate the structural and functional requirements of the design for the second package 300. The devices may be formed using any suitable methods.

The substrate 302 may also include metallization layers (not shown) and conductive vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 303 and 304. Any suitable materials or layers of material that may be used for the bond pads 303 and 304 are fully intended to be included within the scope of the current application. In some embodiments, the conductive vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked dies 308 may be memory dies such as low-power (LP) double data rate (DDR) memory modules, such as LPDDR1, LPDDR2, LPDDR3, LPDDR4, or the like memory modules.

The stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing process may be performed to cure the molding material 312; the curing process may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second package 300.

After the second package 300 is formed, the second package 300 is mechanically and electrically bonded to the first package 200 by way of conductive connectors 314, the bond pads 304, and the metallization pattern 110. In some embodiments, the stacked dies 308 may be coupled to the integrated circuit dies 126 through the wire bonds 310, the bond pads 303 and 304, conductive vias 306, the conductive connectors 314, and the through vias 116.

In some embodiments, a solder resist (not shown) is formed on the side of the substrate 302 opposing the stacked dies 308. The conductive connectors 314 may be disposed in openings in the solder resist to be electrically and mechanically coupled to conductive features (e.g., the bond pads 304) in the substrate 302. The solder resist may be used to protect areas of the substrate 302 from external damage.

In some embodiments, the conductive connectors 314 have an epoxy flux (not shown) formed thereon before they are reflowed with at least some of the epoxy portion of the epoxy flux remaining after the second package 300 is attached to the first package 200.

In some embodiments, an underfill 316 is formed between the first package 200 and the second package 300 and surrounding the conductive connectors 314. The underfill 316 may reduce stress and protect the joints resulting from the reflowing of the conductive connectors 314. The underfill 316 may be formed by a capillary flow process after the first package 200 is attached or may be formed by a suitable deposition method before the first package 200 is attached. In embodiments where the epoxy flux is formed, it may act as the underfill 316.

FIG. 13B is a detailed view of a region 18 of the conductive connectors 314 after the second packages 300 are attached to the first packages 200. A subset of the conductive connectors 314 are placed along an edge or a corner of the integrated circuit die 126, in a top-down view. Similar to the conductive connectors 162, the conductive connectors 314 placed along edges and corners of the integrated circuit die 126 may be subjected to increased strain. For example, conductive connectors 314 along the edges and corners of the integrated circuit die 126 may be subject to over 200% more strain than conductive connectors 314 in the center of the integrated circuit die 126. By improving the adhesion of the interface between the dielectric layer 112 and encapsulant 142/adhesive 128 in prior steps (e.g., with the surface treatment processes 122 and 124), the chances of the dielectric layer 112 delaminating from the integrated circuit die 126 when under increased strain may be decreased. More costly delamination solutions, such as rearranging the positions of the integrated circuit die 126 or conductive connectors 314, may thus be avoided. This may allow the integrated circuit dies 126 to be more uniformly distributed in the resulting first packages 200, allowing the encapsulant 142 to be more uniformly distributed around the integrated circuit dies 126.

The conductive connectors 314 along the edges and corners of the integrated circuit die 126 may be formed overlapping the edges and corners of the integrated circuit die 126. In an embodiments, a conductive connector 314 is disposed in a margin area near an edge or a corner of the integrated circuit die 126. Boundaries of the margin area are disposed a distance $D_5$ from the edge or corner of the integrated circuit die 126. The distance $D_5$ may be equal to the distance $D_2$. In an embodiment, the distance $D_5$ may be about 25 μm. The entirety of the margin area may be occupied by the conductive connector 314. A first side of the conductive connector 314 is disposed a distance $D_6$ outside of the margin area, and a second side of the conductive connector 314 is disposed a distance $D_7$ outside of the margin area. In an embodiment, the distances $D_6$ and $D_7$ may each be at least one quarter of the total width of the respective conductive connector 314. In other words, when the conductive connectors 314 have a width, at least one quarter of the width of each respective conductive connector 314 is disposed over the integrated circuit die 126, and at least one quarter of the width of each respective conductive connector 314 is disposed over the encapsulant 142.

FIG. 13C is a top-down view showing some features of the device of FIG. 13A. Some features or layers are omitted from FIG. 13C for clarity of illustration. A corner of the integrated circuit die 126 is shown, and is encapsulated by the encapsulant 142. Portions of the metallization pattern 110 that the conductive connector 314 couple are shown. The conductive connectors 314 are coupled to pads 110A and 110B in the metallization pattern 110. Some of the pads 110B are disposed in the margin area near the edge or corner of the integrated circuit die 126 (e.g., are disposed less than the distance $D_5$ from the edge of the integrated circuit die 126). In some embodiments, a first shape of pad 110A is disposed over the integrated circuit die 126, and a second shape of pad 110B is disposed over the encapsulant 142. In other embodiments, the pads all have the same shape.

In FIG. 14, a singulation process is performed by sawing along scribe line regions, e.g., between the first package region 100A and the second package region 100B. The sawing singulates the first package region 100A from the second package region 100B. The resulting, singulated first packages 200 and second packages 300 are from one of the first package region 100A or the second package region 100B. In some embodiments, the singulation process is performed after the second package 300 is attached to the first package 200. In other embodiments (not shown), the singulation process is performed before the second package 300 is attached to the first package 200, such as after the carrier substrate 102 is de-bonded and the openings 166 are formed.

The first package 200 is then mounted to a package substrate 400 using the conductive connectors 162. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 162 are reflowed to attach the first package 200 to the bond pads 402. The conductive connectors 162 electrically and/or physically couple the package substrate 400, including metallization layers in the package substrate 400, to the first package 200. In some embodiments, passive devices (e.g., surface mount devices (SMDs), not illustrated) may be attached to the first package 200 (e.g., bonded to the bond pads 402) prior to mounting on the package substrate 400. In such embodiments, the passive devices may be bonded to a same surface of the first package 200 as the conductive connectors 162.

The conductive connectors 162 may have an epoxy flux (not shown) formed thereon before they are reflowed with at least some of the epoxy portion of the epoxy flux remaining after the first package 200 is attached to the package substrate 400. This remaining epoxy portion may act as an underfill to reduce stress and protect the joints resulting from the reflowing the conductive connectors 162. In some embodiments, an underfill (not shown) may be formed between the first package 200 and the package substrate 400 and surrounding the conductive connectors 162. The underfill may be formed by a capillary flow process after the first package 200 is attached or may be formed by a suitable deposition method before the first package 200 is attached.

Embodiments may achieve advantages. Removing residual metal 120 from the dielectric layer 112 may improve the adhesion of the interface between the dielectric layer 112 and encapsulant 142/adhesive 128. This may allow the conductive connectors 314 to be formed closer to the edges and corners of the integrated circuit die 126 without delaminating. Further, by improving the adhesion of the interface, the encapsulant 142 and integrated circuit die 126 are less likely to exert forces on the front-side redistribution structure 144. This may also allow the conductive connectors 162 to be formed closer to the edges and corners of the integrated circuit die 126 without delaminating. The I/O count of the resulting device may thus be increased.

In an embodiment, a device includes: a first redistribution structure including a first dielectric layer; a die adhered to a first side of the first redistribution structure; an encapsulant laterally encapsulating the die, the encapsulant being bonded to the first dielectric layer with first covalent bonds; a through via extending through the encapsulant; and first conductive connectors electrically connected to a second side of the first redistribution structure, a subset of the first conductive connectors overlapping an interface of the encapsulant and the die.

In some embodiments of the device, the encapsulant includes a molding compound and a nucleophile. In some embodiments of the device, the nucleophile is ethylene glycol, 2-ethoxyethanol, or ethanolamine hydrochloride. In some embodiments, the device further includes: an adhesive adhering the die to the first dielectric layer, the adhesive being bonded to the first dielectric layer with second covalent bonds. In some embodiments of the device, the adhesive includes an epoxy and the nucleophile. In some embodiments of the device, each respective conductive connector of the subset of the first conductive connectors has a width, where at least one quarter of the width of each respective conductive connector is disposed over the die, where at least one quarter of the width of each respective conductive connector is disposed over the encapsulant. In some embodiments, the device further includes: a second redistribution structure electrically connected to the through via and the die, the encapsulant disposed between the first redistribution structure and the second redistribution structure; and second conductive connectors electrically connected to the second redistribution structure, a subset of the second conductive connectors overlapping the interface of the encapsulant and the die. In some embodiments, the device further includes: a device package connected to the first redistribution structure with the first conductive connectors; and a package substrate connected to the second redistribution structure with the second conductive connectors.

In an embodiment, a method includes: forming a first dielectric layer over a first metallization pattern; forming a through via extending through the first dielectric layer, the through via electrically connected to the first metallization pattern; adhering a die to a first surface of the first dielectric layer; bonding an encapsulant to the first surface of the first dielectric layer with first covalent bonds, the encapsulant laterally encapsulating the die and the through via; forming a second dielectric layer over the encapsulant; and forming a second metallization pattern extending through the second dielectric layer, the second metallization pattern electrically connected to the die and the through via.

In some embodiments, the method further includes: forming first conductive connectors electrically connected to the first metallization pattern, a subset of the first conductive connectors overlapping an edge or a corner of the die; and connecting a device package to the first metallization pattern with the first conductive connectors. In some embodiments, the method further includes: forming second conductive connectors electrically connected to the second metallization pattern, a subset of the second conductive connectors overlapping the edge or the corner of the die; and connecting a package substrate to the second metallization pattern with the second conductive connectors. In some embodiments, the method further includes: treating the first surface of the first dielectric layer to form dangling hydroxyl groups on the first surface of the first dielectric layer. In some embodiments of the method, bonding the encapsulant to the first surface of the first dielectric layer includes: dispensing the encapsulant on the first surface of the first dielectric layer, the encapsulant including a molding compound and a nucleophile; and curing the encapsulant to form the first covalent bonds between the dangling hydroxyl groups and the nucleophile. In some embodiments of the method, adhering the die to the first surface of the first dielectric layer includes: dispensing an adhesive on the die, the adhesive including an epoxy and a nucleophile; and curing the adhesive to react the dangling hydroxyl groups and the nucleophile and form second covalent bonds. In some embodiments of the method, treating the first surface of the first dielectric layer includes: performing a first surface treatment process to simultaneously etch and hydroxylate the first surface of the first dielectric layer; and performing a second surface treatment process to remove residual metal exposed by etching the first surface of the first dielectric layer. In some embodiments of the method, the first surface treatment process is a plasma treatment process and the second surface treatment process is a wet etch process, where precursors of the plasma treatment process include $O_2$ and $H_2$.

In an embodiment, a method includes: plating a through via through a first dielectric layer with seed layer; etching exposed portions of the seed layer, residual metal of the seed layer remaining after etching the seed layer; treating a first surface of the first dielectric layer to hydroxylate the first surface and remove the residual metal of the seed layer from the first surface; adhering a die to the hydroxylated first surface; and bonding an encapsulant to the hydroxylated first surface with first covalent bonds, the encapsulant laterally encapsulating the die and the through via; and forming a second dielectric layer over the encapsulant and the die.

In some embodiments of the method, adhering the die to the hydroxylated first surface includes: bonding an adhesive to the hydroxylated first surface with second covalent bonds, the adhesive adhering the die to the hydroxylated first surface. In some embodiments of the method, treating the first surface of the first dielectric layer includes: performing a first surface treatment process to hydroxylate the first surface of the first dielectric layer; and performing a second surface treatment process to remove the residual metal of the seed layer from the hydroxylated first surface. In some embodiments of the method, bonding the encapsulant to the hydroxylated first surface includes: dispensing the encapsulant on the hydroxylated first surface, the encapsulant including a molding compound and a nucleophile; and curing the encapsulant to form the first covalent bonds between the hydroxylated first surface and the nucleophile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first dielectric layer over a first metallization pattern;
   forming a through via extending through the first dielectric layer, the through via electrically connected to the first metallization pattern;
   treating a first surface of the first dielectric layer to form dangling hydroxyl groups on the first surface of the first dielectric layer, wherein treating the first surface of the first dielectric layer comprises:
   performing a first surface treatment process to simultaneously etch and hydroxylate the first surface of the first dielectric layer; and
   performing a second surface treatment process to remove residual metal exposed by etching the first surface of the first dielectric layer;
   adhering a die to the first surface of the first dielectric layer;
   after treating the first surface of the first dielectric layer and adhering the die to the first surface of the first dielectric layer, bonding an encapsulant to the first surface of the first dielectric layer with first covalent bonds using the dangling hydroxyl groups, the encapsulant laterally encapsulating the die and the through via;
   forming a second dielectric layer over the encapsulant; and
   forming a second metallization pattern extending through the second dielectric layer, the second metallization pattern electrically connected to the die and the through via.

2. The method of claim 1 further comprising:
   forming first conductive connectors electrically connected to the first metallization pattern, a subset of the first conductive connectors overlapping an edge or a corner of the die; and
   connecting a device package to the first metallization pattern with the first conductive connectors.

3. The method of claim 2 further comprising:
   forming second conductive connectors electrically connected to the second metallization pattern, a subset of the second conductive connectors overlapping the edge or the corner of the die; and
   connecting a package substrate to the second metallization pattern with the second conductive connectors.

4. The method of claim 1, wherein bonding the encapsulant to the first surface of the first dielectric layer comprises:
   dispensing the encapsulant on the first surface of the first dielectric layer, the encapsulant comprising a molding compound and a nucleophile; and
   curing the encapsulant to form the first covalent bonds between the dangling hydroxyl groups and the nucleophile.

5. The method of claim 1, wherein adhering the die to the first surface of the first dielectric layer comprises:
   dispensing an adhesive on the die, the adhesive comprising an epoxy and a nucleophile; and
   curing the adhesive to react the dangling hydroxyl groups and the nucleophile and form second covalent bonds.

6. The method of claim 1, wherein the first surface treatment process is a plasma treatment process and the second surface treatment process is a wet etch process, wherein precursors of the plasma treatment process include $O_2$ and $H_2$.

7. A method comprising:
   plating a through via through a first dielectric layer with a seed layer;
   etching exposed portions of the seed layer, residual metal of the seed layer remaining after etching the seed layer;
   treating a first surface of the first dielectric layer to hydroxylate the first surface and remove the residual metal of the seed layer from the first surface, wherein treating the first surface of the first dielectric layer comprises:
   performing a first surface treatment process to simultaneously etch and hydroxylate the first surface of the first dielectric layer; and
   performing a second surface treatment process to remove the residual metal of the seed layer from the hydroxylated first surface;
   adhering a die to the hydroxylated first surface; and
   bonding an encapsulant to the hydroxylated first surface with first covalent bonds, the encapsulant laterally encapsulating the die and the through via; and
   forming a second dielectric layer over the encapsulant and the die.

8. The method of claim 7, wherein adhering the die to the hydroxylated first surface comprises:

bonding an adhesive to the hydroxylated first surface with second covalent bonds, the adhesive adhering the die to the hydroxylated first surface.

9. The method of claim 7, wherein bonding the encapsulant to the hydroxylated first surface comprises:
dispensing the encapsulant on the hydroxylated first surface, the encapsulant comprising a molding compound and a nucleophile; and
curing the encapsulant to form the first covalent bonds between the hydroxylated first surface and the nucleophile.

10. The method of claim 7, wherein the first surface treatment process decreases a thickness of the first dielectric layer, and the second surface treatment process does not decrease the thickness of the first dielectric layer.

11. The method of claim 7 further comprising:
forming the first dielectric layer over a metallization pattern;
forming a conductive connector electrically connected to the metallization pattern, the conductive connector overlapping a corner of the die; and
connecting a device package to the metallization pattern with the conductive connector.

12. The method of claim 7 further comprising:
forming the first dielectric layer over a metallization pattern;
forming a conductive connector electrically connected to the metallization pattern, the conductive connector overlapping an edge of the die; and
connecting a device package to the metallization pattern with the conductive connector.

13. The method of claim 9, wherein the nucleophile is ethylene glycol, 2-ethoxyethanol, or ethanolamine hydrochloride.

14. A method comprising:
depositing a seed layer in an opening in a first dielectric layer and on a first surface of the first dielectric layer;
plating a conductive material from the seed layer;
etching exposed portions of the seed layer to form a through via comprising the conductive material and portions of the seed layer underlying the conductive material, wherein residual portions of the seed layer remain in the first surface of the first dielectric layer;
treating the first surface of the first dielectric layer to remove the residual portions of the seed layer and form dangling hydroxyl groups on the first surface of the first dielectric layer, wherein treating the first surface of the first dielectric layer comprises:
performing a plasma treatment process with $O_2$ and $H_2$, wherein the plasma treatment process decreases a thickness of the first dielectric layer; and
performing a wet etch with hydrofluoric acid, wherein the wet etch does not decreases the thickness of the first dielectric layer;
adhering an integrated circuit die to the first surface of the first dielectric layer with an adhesive, the adhesive comprising a nucleophile;
dispensing an encapsulant on the first surface of the first dielectric layer, the encapsulant laterally surrounding the integrated circuit die and the through via, the encapsulant comprising the nucleophile; and
reacting the nucleophile with the dangling hydroxyl groups to form covalent bonds between the first dielectric layer and each of the adhesive and the encapsulant.

15. The method of claim 14, wherein reacting the nucleophile with the dangling hydroxyl groups comprises curing the encapsulant.

16. The method of claim 14 further comprising:
forming a redistribution structure on the encapsulant, the integrated circuit die, and the through via;
connecting a conductive connector to the redistribution structure, the conductive connector laterally disposed over an interface of the encapsulant and a sidewall of the integrated circuit die; and
connecting a package substrate to the redistribution structure with the conductive connectors.

17. The method of claim 16, wherein the conductive connector is laterally disposed over a corner of the integrated circuit die.

18. The method of claim 16, wherein the conductive connector is laterally disposed over an edge of the integrated circuit die.

19. The method of claim 14, wherein the nucleophile is ethylene glycol, 2-ethoxyethanol, or ethanolamine hydrochloride.

* * * * *